United States Patent
Bloomquist et al.

(10) Patent No.: US 6,809,958 B2
(45) Date of Patent: Oct. 26, 2004

(54) MRAM PARALLEL CONDUCTOR ORIENTATION FOR IMPROVED WRITE PERFORMANCE

(75) Inventors: Darrel Bloomquist, deceased, late of Meridian, ID (US), by Judy Bloomquist, legal representative; David H. McIntyre, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 33 days.

(21) Appl. No.: 10/243,469

(22) Filed: Sep. 13, 2002

(65) Prior Publication Data

US 2004/0052104 A1 Mar. 18, 2004

(51) Int. Cl.[7] .................. G11C 11/15; G11C 5/06; G11C 5/02
(52) U.S. Cl. .................. 365/158; 365/171; 365/173; 365/66; 365/51
(58) Field of Search .................. 365/158, 63, 66, 365/51, 171, 173

(56) References Cited

U.S. PATENT DOCUMENTS

| | | | |
|---|---|---|---|
| 4,455,626 A | * 6/1984 | Lutes | ................. 365/158 |
| 5,343,422 A | 8/1994 | Kung et al. | |
| 5,420,819 A | * 5/1995 | Pohm | ................. 365/158 |
| 5,587,943 A | * 12/1996 | Torok et al. | ................. 365/158 |
| 5,745,408 A | 4/1998 | Chen et al. | |
| 5,898,547 A | 4/1999 | Fontana, Jr. et al. | |
| 5,982,660 A | 11/1999 | Bhattacharyya et al. | |
| 6,081,446 A | 6/2000 | Brug et al. | |
| 6,097,626 A | 8/2000 | Brug et al. | |
| 6,111,783 A | 8/2000 | Tran et al. | |
| 6,130,835 A | 10/2000 | Scheuerlein | |
| 6,134,139 A | 10/2000 | Bhattacharyya et al. | |
| 6,163,477 A | 12/2000 | Tran | |
| 6,466,471 B1 | * 10/2002 | Bhattacharyya | ................. 365/55 |
| 6,590,803 B2 | * 7/2003 | Saito et al. | ................. 365/158 |

* cited by examiner

Primary Examiner—Richard Elms
Assistant Examiner—J. H. Hur (57) ABSTRACT

A magnetic random access memory array includes a data storage layer having an easy axis. A non-linear first conductor is positioned on a first side of the data storage layer, wherein a portion of the first conductor has an angle of orientation that is perpendicular to the easy axis. A non-linear second conductor is positioned on a second side of the data storage layer, wherein a portion of the second conductor also has an angle of orientation that is perpendicular to the easy axis.

10 Claims, 8 Drawing Sheets

MRAM PARALLEL CONDUCTOR ORIENTATION FOR IMPROVED WRITE PERFORMANCE

THE FIELD OF THE INVENTION

The present invention generally relates to an optimal write conductor layout in a magnetic random access memory (MRAM). More particularly, the present invention relates to a write conductor layout wherein the write conductors are in generally parallel alignment as they cross the MRAM memory cell to provide improved half-select margins and to reduce write current requirements.

BACKGROUND OF THE INVENTION

An MRAM device includes an array of memory cells. The typical magnetic memory cell includes a layer of magnetic film in which the magnetization is alterable and a layer of magnetic film in which the magnetization is fixed or "pinned" in a particular direction. The magnetic film having alterable magnetization may be referred to as a data storage layer and the magnetic film which is pinned may be referred to as a reference layer.

Conductive traces (commonly referred to as word lines and bit lines) are routed across the array of memory cells. Word lines extend along rows of the memory cells, and bit lines extend along columns of the memory cells. Located at each intersection of a word line and a bit line, each memory cell stores the bit of information as an orientation of a magnetization. Typically, the orientation of magnetization in the data storage layer aligns along an axis of the data storage layer that is commonly referred to as its easy axis. External magnetic fields are applied to flip the orientation of magnetization in the data storage layer along its easy axis to either a parallel or anti-parallel orientation with respect to the orientation of magnetization in the reference layer, depending on the desired logic state.

The orientation of magnetization of each memory cell will assume one of two stable orientations at any given time. These two stable orientations, parallel and anti-parallel, represent logical values of "1" and "0". The orientation of magnetization of a selected memory cell may be changed by supplying current to a word line and a bit line crossing the selected memory cell. The currents create magnetic fields that, when combined, can switch the orientation of magnetization of the selected memory cell from parallel to anti-parallel or vice versa.

A selected magnetic memory cell is usually written by applying electrical currents to the particular word and bit lines that intersect at the selected magnetic memory cell. Typically, an electrical current applied to the particular bit line generates a magnetic field substantially aligned along the easy axis of the selected magnetic memory cell. The magnetic field aligned to the easy axis may be referred to as a longitudinal write field. An electrical current applied to the particular word line usually generates a magnetic field substantially perpendicular to the easy axis of the selected magnetic memory cell.

Preferably, only the selected magnetic memory cell receives both the longitudinal and the perpendicular write fields. Other magnetic memory cells coupled to the particular word line usually receive only the perpendicular write field. Other magnetic memory cells coupled to the particular bit line usually receive only the longitudinal write field.

The magnitudes of the longitudinal and the perpendicular write fields are usually chosen to be high enough so that the selected magnetic memory cell switches its logic state when subjected to both longitudinal and perpendicular fields, but low enough so that the other magnetic memory cells which are subject only to either the longitudinal or the perpendicular write field do not switch. An undesirable switching of a magnetic memory cell that receives only the longitudinal or the perpendicular write field is commonly referred to as half-select switching.

Manufacturing variation among the magnetic memory cells often increases the likelihood of half-select switching. For example, manufacturing variation in the longitudinal or perpendicular dimensions or shapes of the magnetic memory cells may increase the likelihood of half-select switching. In addition, variation in the thicknesses or the crystalline anisotropy of data storage layers may increase the likelihood of half-select switching. Unfortunately, such manufacturing variation decreases the yield in manufacturing processes for magnetic memories and reduces the reliability of prior magnetic memories.

Because the word lines and the bit lines operate in combination to switch the orientation of magnetization of the selected memory cell (i.e., to write the memory cell), the word lines and bit lines can be collectively referred to as write lines. Additionally, the write lines can also be used to read the logic values stored in the memory cell.

Figure 1A:
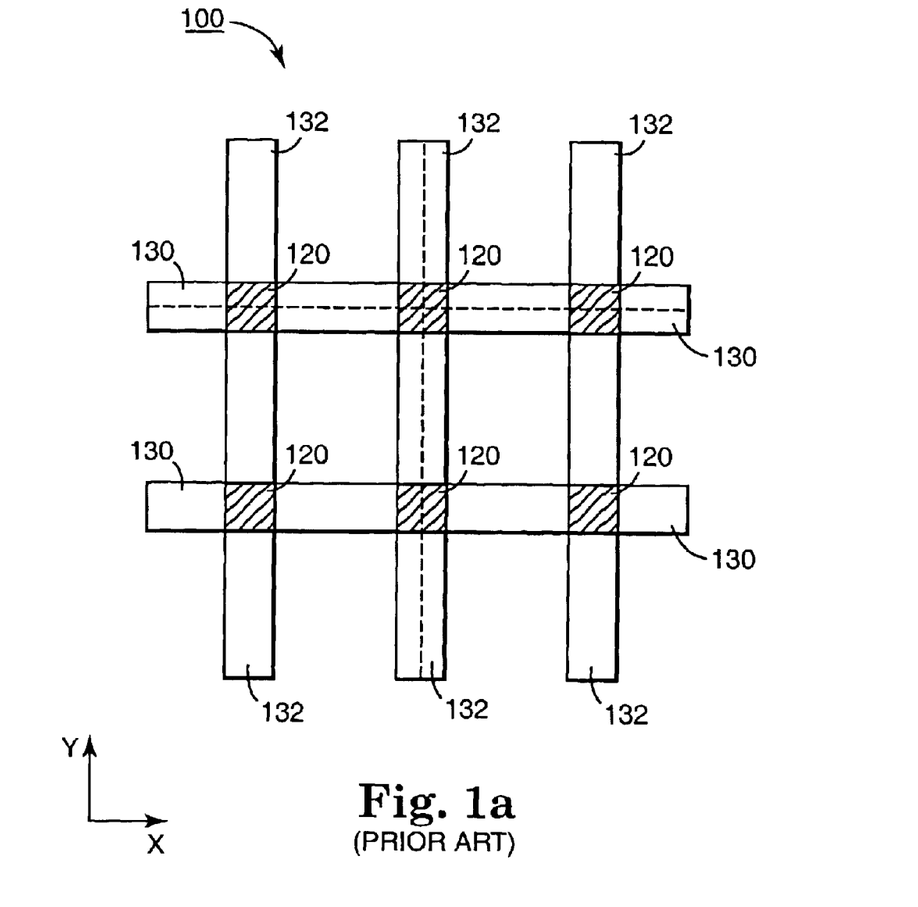
FIGS. 1a and 1b are top and profile views of a prior art MRAM array.
Figure 1B:
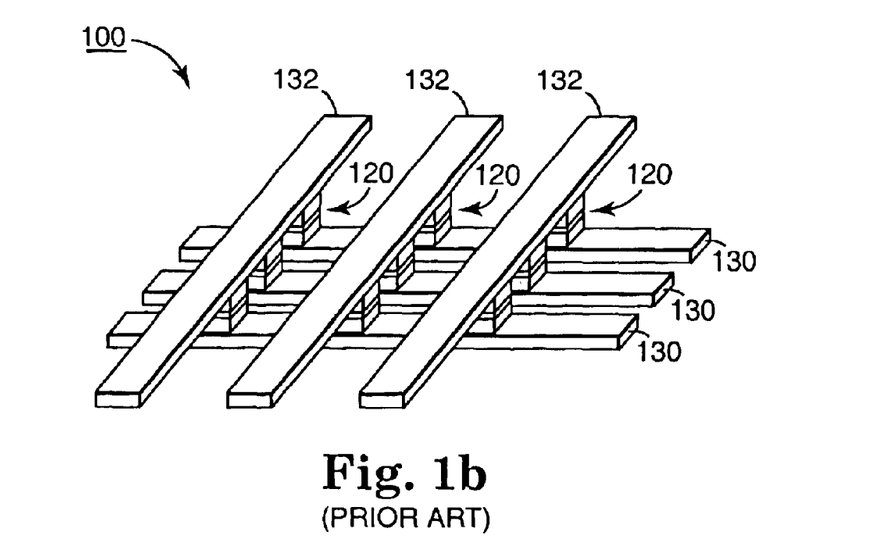

FIG. 1 illustrates a top plan view of a simplified prior art MRAM array 100. The array 100 includes memory cells 120, word lines 130, and bit lines 132. The memory cells 120 are positioned at each intersection of a word line 130 with a bit line 132. Most commonly, the word lines 130 and bit lines 132 are arranged in orthogonal relation to one another and the memory cells 120 are positioned in between the write lines (130,132), is illustrated in FIG. 1b. For example, the bit lines 132 can be positioned above the memory cells 120 and the word lines 130 can be positioned below.

Figure 2A:
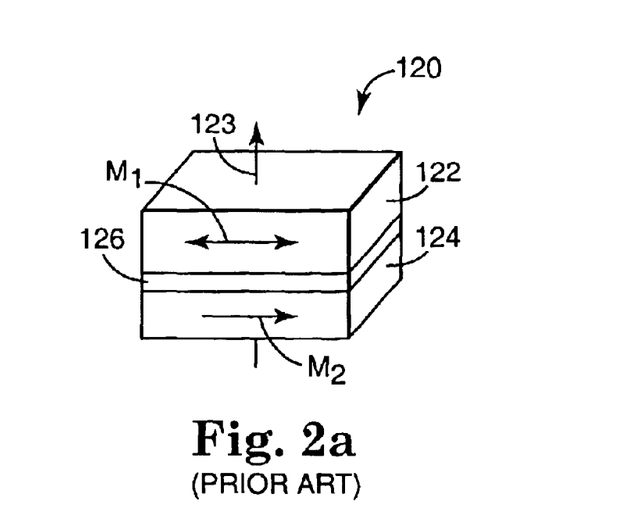
FIGS. 2a through 2c are profile and side views of a prior art MRAM memory cell illustrating an orientation of magnetization of active and reference magnetic films.
Figure 2B:
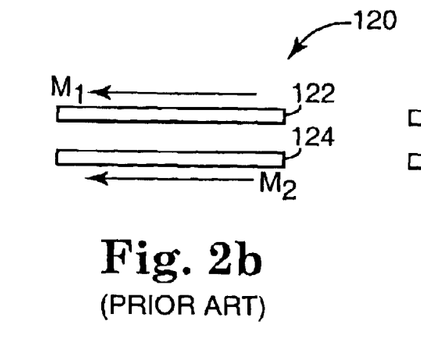
Figure 2C:
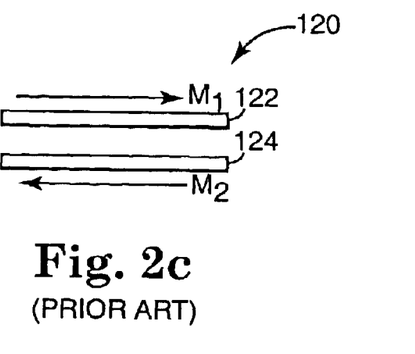

FIGS. 2a through 2c illustrate the storage of a bit of data in a single memory cell 120. In FIG. 2a, the memory cell 120 includes an active magnetic data film 122 and a pinned magnetic film 124 which are separated by a dielectric region 126. The orientation of magnetization in the active magnetic data film 122 is not fixed and can assume two stable orientations is shown by arrow $M_1$. On the other hand, the pinned magnetic film 124 has a fixed orientation of magnetization shown by arrow $M_2$. The active magnetic data film 122 rotates its orientation of magnetization in response to electrical currents applied to the write lines (130,132, not shown) during a write operation to the memory cell 120. The first logic state of the data bit stored in as memory cell 120 is indicated when $M_1$ and $M_2$ are parallel to each other as illustrated in FIG. 2b. For instance, when $M_1$ and $M_2$ are parallel a logic "1" state is stored in the memory cell 120. Conversely, a second logic state is indicated when $M_1$ and $M_2$ are anti-parallel to each other as illustrated in FIG. 2c. Similarly, when $M_1$ and $M_2$ are antiparallel a logic "0" state is stored in the memory cell 120. In FIGS. 2b and 2c the dialectic region 126 has been omitted. Although FIGS. 2a through 2c illustrate the active magnetic data film 122 positioned above the pinned magnetic film 124, the pinned magnetic film 124 can be positioned above the active magnetic data film 122.

The resistance of the memory cell 120 differs according to the orientations of $M_1$ and $M_2$. When $M_1$ and $M_2$ are anti-parallel, i.e., the logic "0" state, the resistance of the memory cell 120 is at its highest. On the other hand, the resistance of the memory cell 120 is at its lowest when the orientations of $M_1$ and $M_2$ are parallel, i.e., the logic "1"

state. As a consequence, the logic state of the data bit stored in the memory cell 120 can be determined by measuring its resistance. The resistance of the memory cell 120 is reflected by a magnitude of a sense current 123 (referring to FIG. 2a) that flows in response to read voltages applied to the write lines (130,132).

Figure 3:
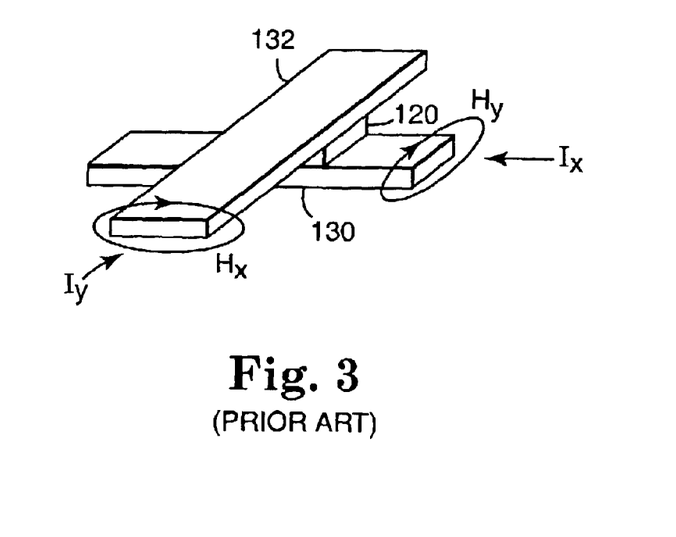
FIG. 3 is a profile view of a prior art memory cell, its write lines, and magnetic fields generated by currents flowing through the write lines.

In FIG. 3, the memory cell 120 is positioned between the write lines (130,132). The active and pinned magnetic films (122,124) are not shown in FIG. 3. The orientation of magnetization of the active magnetic data film 122 is rotated in response to a current $I_x$ that generates a magnetic field $H_y$, and a current $I_y$ that generates a magnetic field $H_x$. The magnetic fields $H_x$ and $H_y$ act in combination to rotate the orientation of magnetization of the memory cell 120.

As can be seen, there is a need for an NRAM array which provides improved half-select margins. Additionally, there is a need to reduce power consumption in the MRAM memory cell by reducing the magnitude of the write currents necessary to rotate the orientation of magnetization of the data storage layer during write operations to the memory cell. For example, reduced power can result in a reduction in the waste heat generated by an electronic device incorporating the MRAM memory. Moreover, for portable devices, it is desirable to reduce power consumption to extend battery life.

SUMMARY OF THE INVENTION

The present invention is a magnetic random access memory array and a unique write conductor layout structure for a magnetic memory cell. The magnetic memory cell includes a data storage layer having an easy axis. A first conductor is positioned on a first side of the data storage layer, wherein a portion of the first conductor has an angle of orientation that is perpendicular to the easy axis. A second conductor is positioned on a second side of the data storage layer, wherein a portion of the second conductor has an angle of orientation that is perpendicular to the easy axis. The MRAM array provides improved half-select margins and reduces power consumption in the MRAM memory cell by reducing the magnitude of the write currents necessary to rotate the orientation of magnetization of the data storage layer during write operations to the memory cell.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 4:
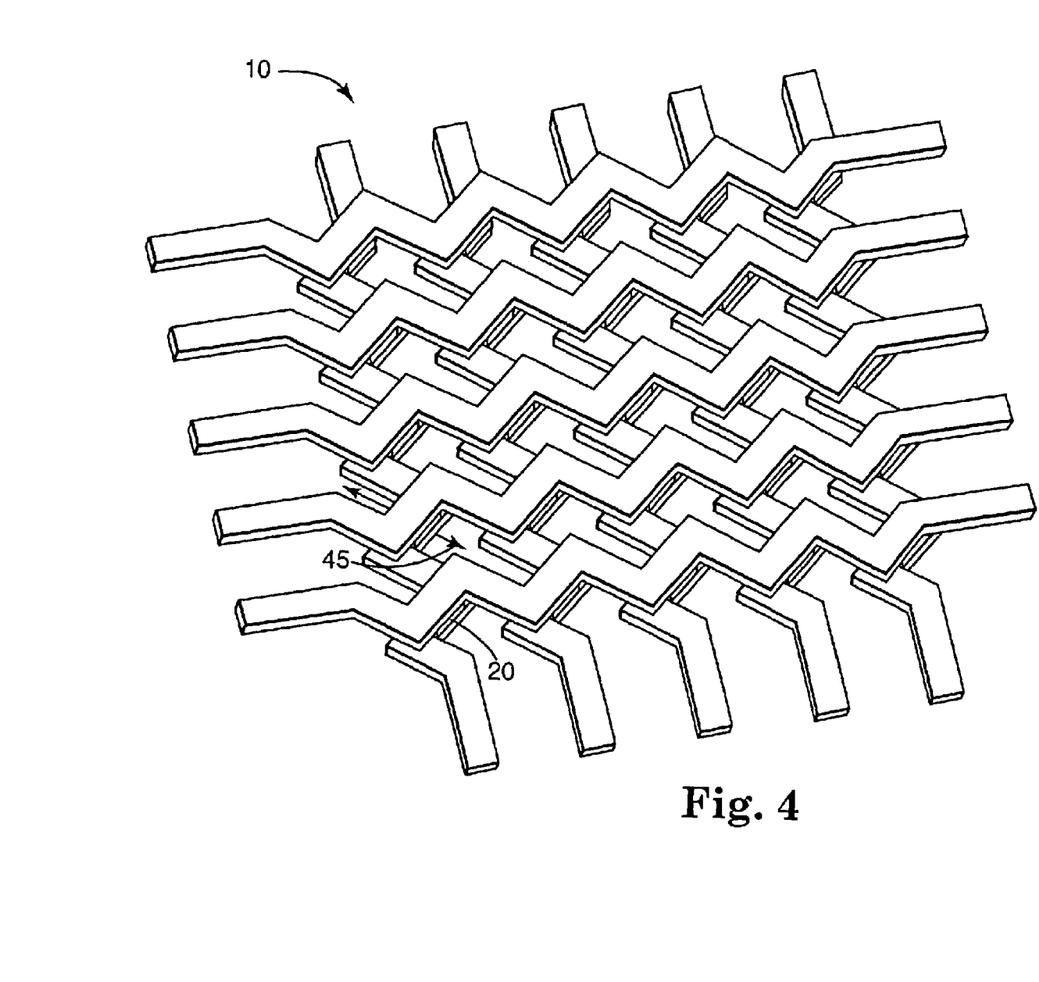
FIG. 4 is a perspective view of an MRAM array of one embodiment of the present invention.

FIG. 4 is a perspective view of a magnetic random access memory (MRAM) 10 according to the present invention. The MRAM 10 includes an array of memory cells 20. The MRAM 10 also includes an array of conductors that enable read and write access to the magnetic memory cells 20.

Figure 5:
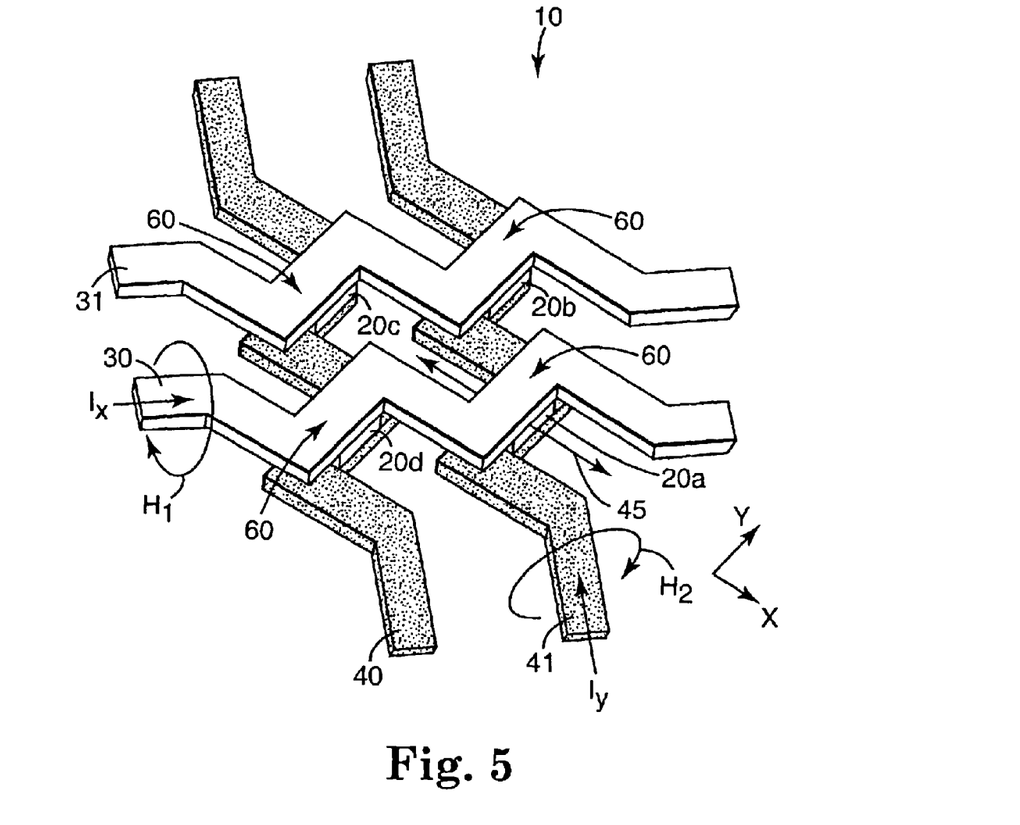
FIG. 5 is an enlarged with perspective view of an MRAM array of one embodiment of the present invention.

For clarity of explanation, FIG. 5 provides a perspective view of a smaller magnetic random access memory (MRAM) 10 according to the present invention. The MRAM 10 includes an array of memory cells 20a, 20b, 20c and 20d. The MRAM 10 also includes an array of conductors 30, 31 and 40, 41 that enable read and write access to the magnetic memory cells 20a–20d. In one embodiment, the conductors 30, 31 are top conductors that define rows of the MRAM 10 and the conductors 40, 41 are bottom conductors that define columns of the MRAM 10.

In one embodiment, the magnetic memory cells 20a–20d each include a magnetic film which functions as a data storage layer, a magnetic film which functions as a reference layer, and a tunnel barrier between the data storage layer and the reference layer. This structure of a magnetic memory cell may be referred to as a spin tunneling device in that electrical charge migrates through the tunnel barrier during read operations. This electrical charge migration through the tunnel barrier is due to a phenomenon known as to spin tunneling and occurs when a read voltages is applied to a magnetic memory cell. In an alternative embodiment, a giant magneto-resistive (GMR) structure may be used in the magnetic memory cells 20a–20d.

Also shown is a set of x-y axes that will be useful in describing the relative orientations of the conductors 30, 31 and 40, 41 to the magnetic memory cells 20a–20d and the relative orientations of magnetic fields applied to the magnetic memory cells 20a–20d during write operations. The x-axis is substantially parallel to the easy axes 45 of the data storage layers of the magnetic memory cells 20a–20d and is also referred to as the longitudinal direction. The y-axis is substantially perpendicular to the easy axes 45 of the data storage layers of the magnetic memory cells 20a–20d and is also referred to as the perpendicular direction.

The magnetic memory cells 20a–20d are formed so that they will have an easy axis 45 which is substantially parallel to the x-axis. The conductors 30, 31 are formed so that their general direction or orientation is substantially orthogonal to the conductors 40, 41. In addition, the conductors 30, 31 and the conductors 40, 41 are each formed so that they have a portion 60 which has an angle of orientation which is substantially along the y-axis. That is, the conductors 30, 31 and 40, 41 are non-linear and each have portions 60 which are in parallel alignment with each other at those points where the memory cells 20a–20d intersect the non-linear conductors 30, 31 and 40, 41. These geometries may be formed using known magnetic film processing techniques including photolithography, masking and etching.

Figure 6A:
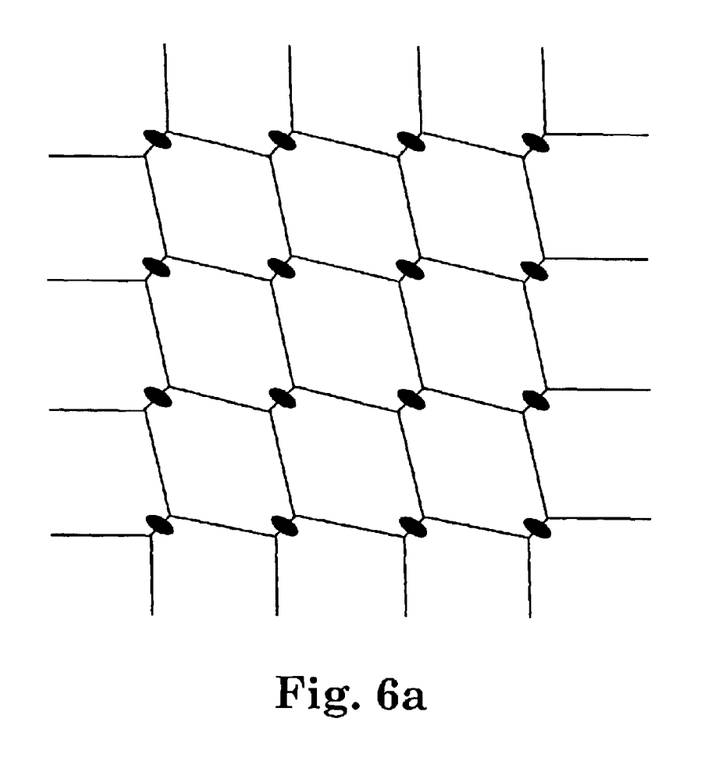
FIGS. 6a and 6b illustrate alternate geometries for the conductors.
Figure 6B:
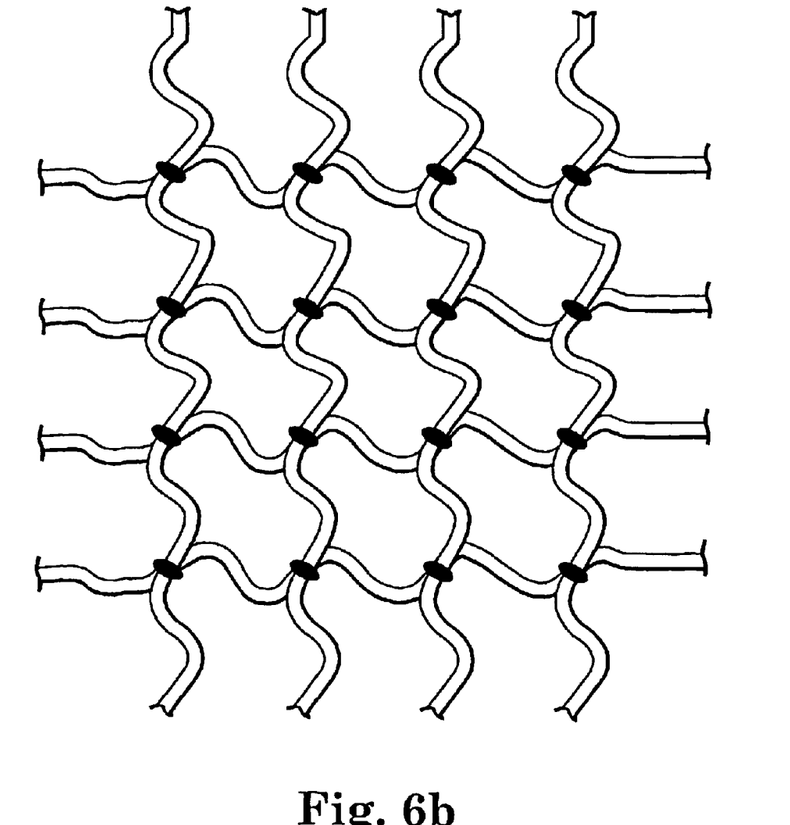

It will be noted by those skilled in the art that the non-linear geometries of the conductors 30, 31 and 40, 41 may be different from that shown in FIGS. 4 and 5. By way of illustration, examples of different non-linear geometries which fall within the scope and spirit of invention are shown in FIGS. 6a and 6b. As in FIGS. 4 and 5 above, the alternate non-linear geometries of FIGS. 6a and 6b provide conductors which have portions which are in parallel alignment with each other at those points where the memory cells intersect the conductors.

The logic states of the magnetic memory cells 20a–20d are manipulated by applying electrical currents to the conductors 30, 31 and 40, 41. For example, the magnetic memory cell 20a is written by applying electrical currents to the conductors 30 and 41 that intersect at the magnetic memory cell 20a. The electrical current applied to the conductor 30 in one direction causes a magnetic field ($H_1$) in the magnetic memory cell 20a according to the right-hand rule. This electrical current in the conductor 30 also causes an $H_1$ field in the magnetic memory cell 20d. Similarly, the logic current applied to the conductor 41 in one direction causes a magnetic field ($H_2$) in the magnetic memory cells 20a and 20b according to the right-hand rule.

The angle of orientation of the conductors 30, 31 and 40, 41 with respect to the easy axes of the data storage layers in the magnetic memory cells 20a–20d is such that the full strength of $H_1$ and $H_2$ are directed along the x-axis (in the longitudinal direction) and combine along the easy axis 45 in the magnetic memory cell 20a. This allows the fields $H_1$ and $H_2$ in the magnetic memory cells 20b and 20d to be well below the strength needed to rotate the data storage layers of the magnetic memory cells 20b and 20d.

Figure 7:
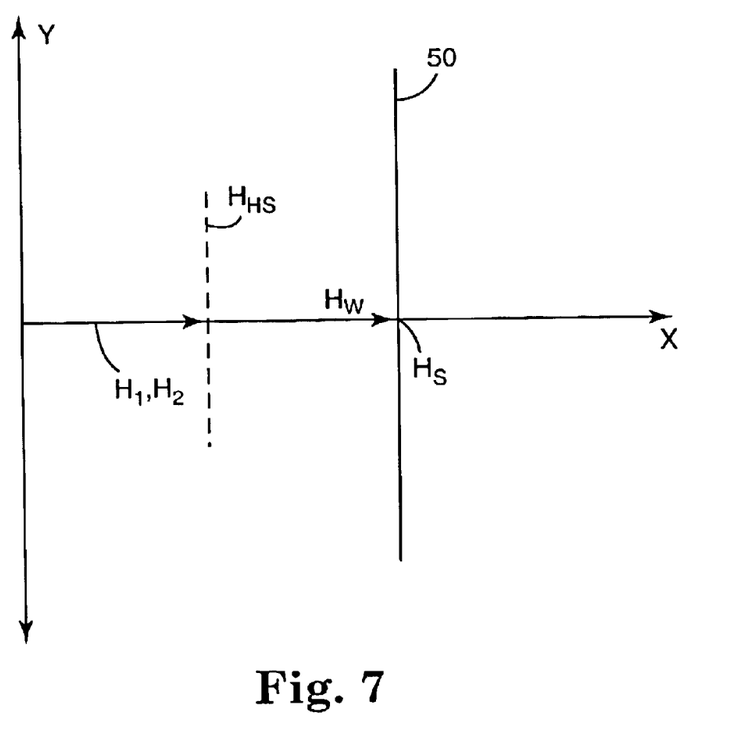
FIG. 7 shows the relationship between the $H_1$ and $H_2$ magnetic fields and the switching characteristics of the data storage layer of a magnetic memory cell.

FIG. 7 shows the relationship between the $H_1$ and $H_2$ fields and the switching characteristics of the data storage layer of the magnetic memory cell 20a. In this embodiment, the angle of orientation of the conductors 30 and 41 with respect to the easy axis of the data storage layer in the memory cell 20a is substantially equal to 0 degrees. Thus, the vectors of $H_1$ and $H_2$ are in parallel alignment with respect to the x-axis. A vector $H_w$ represents a vector which results from a combination of the $H_1$ and $H_2$ vectors.

The line 50 represents a theoretical switching characteristic for the data storage layer of the magnetic memory cell 20a. The line 50 shows that a magnetic field having a minimum magnitude equal to $H_s$ is needed to flip the orientation of the magnetization in the data storage layer of the magnetic memory cell 20a between the −x and the +x directions.

The magnitudes of the $H_1$ and $H_2$ fields are pre-selected so that the resulting field $H_w$ has a magnitude that is greater than or equal to the magnitude $H_s$ needed to write to the magnetic memory cell 20a. For example, if the $H_1$ and $H_2$ fields are such that the field $H_w$ has a magnitude equal to the magnitude $H_s$, and the $H_1$ and $H_2$ fields each have an x-component with a magnitude HHS equal to $H_s/2$. This means that the magnetic memory cells 20b and 20d are each subject to a writing field equal to $H_s/2$ in their longitudinal directions during write operations to the magnetic memory cell 20a. This is equivalent to a 100 percent half-select margin. It may be preferable that the magnitudes of the $H_1$ and $H_2$ fields be slightly larger than necessary to yield the $H_w$ field to provide a write margin In practice, the switching characteristic represented by the line 50 varies among the magnetic memory cells 20a–20d due to manufacturing variations. In addition, the switching characteristic may be such that lower magnitudes of the $H_1$ or $H_2$ fields can cause switching in the magnetic memory cells 20b and 20d in the presence of a perpendicular field. In other words, the line 50 may curve back toward the y-axis at points that are farther away from the x-axis. This may be due to a variety of factors. For example, their may be manufacturing variation in the crystalline anisotropy value (Hk) of the data storage layers of the magnetic memory cells 20a–20d. In addition, there may be variations in the thickness or shape of the magnetic layers of the magnetic memory cells 20a–20d. For example, photolithography process steps may produce rounded edges rather than rectangular edges on the data storage layers. Moreover, data storage layers having square rather than rectangular shapes may have significantly different switching characteristics.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A magnetic memory device comprising:
   a plurality of non-linear first conductors positioned in a first plane;
   a plurality of non-linear second conductors positioned in a second plane;
   a plurality of magnetic memory cells operatively positioned in a third plane between the plurality of first and second conductors, wherein each memory cell includes an easy axis, and wherein the easy axes of all the memory cells share a common orientation.

2. The magnetic memory device of claim 1, wherein the plurality of first and second conductors are curvilinear.

3. The magnetic memory device of claim 1, wherein each of the plurality of nonlinear first and second conductors have portions that are perpendicular to the easy axis orientation, and portions that are parallel to the easy axis orientation, and wherein the perpendicular portions and parallel portions are of unequal length.

4. The magnetic memory device of claim 3, wherein the perpendicular portions are shorter than the parallel portions.

5. The magnetic memory device of claim 3, wherein the perpendicular portions are longer than the parallel portions.

6. The magnetic memory device of claim 3, wherein the pluralities of first and second conductors form a honeycomb pattern.

7. A magnetic memory device comprising:
   a first magnetic memory cell and a second magnetic memory cell, each having an easy axis;
   a non-linear first conductor positioned on a first side of the first and second magnetic memory cells;
   a non-linear second conductor positioned on a second side of the first magnetic memory cell;
   a non-linear third conductor positioned on a second side of the second magnetic memory cell;
   wherein the first and second magnetic memory cells are positioned adjacent each other along the first conductor, and wherein the easy axes of the first and second memory cells are commonly oriented.

8. The magnetic memory device of claim 7, wherein the first, second and third conductors are curvilinear.

9. The magnetic memory device of claim 7, further comprising:
   a third magnetic memory cell positioned adjacent the first and second magnetic memory cells along the first conductor, the third magnetic memory cell having an easy axis commonly oriented with the easy axes of the first and second magnetic memory cells; and a nonlinear fourth conductor positioned on a second side of the third magnetic memory cell.

10. A magnetic memory device comprising:

an array of non-linear conductors forming intersecting pairs of conductors;

a plurality of magnetic memory cells each having an easy axis, each one of the plurality of magnetic memory cells positioned at a unique intersection of a pair of the array of conductors, wherein a portion of the plurality of magnetic memory cells share a common conductor, and wherein the easy axes of the memory cells sharing the common conductor are commonly oriented.

* * * * *